(12) United States Patent
Arai et al.

(10) Patent No.: US 6,252,246 B1
(45) Date of Patent: Jun. 26, 2001

(54) ORGANIC ELECTROLUMINESCENT DEVICE (75) Inventors: Michio Arai; Isamu Kobori; Etsuo Mitsuhashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/339,804

(22) Filed: Jun. 25, 1999

(30) Foreign Application Priority Data

Apr. 5, 1999 (JP) .................................................. 11-097842

(51) Int. Cl.⁷ .............................. H01L 35/24; H01L 51/00
(52) U.S. Cl. .................................. 257/40; 257/94; 257/96; 257/103; 313/503; 313/504; 313/506; 438/46; 438/47
(58) Field of Search ................................. 257/40, 103, 94, 257/96; 438/46, 47; 313/504, 503, 506

(56) References Cited

U.S. PATENT DOCUMENTS

| 5,457,565 | 10/1995 | Wamiki et al. | 359/273 |
| 5,619,058 | * 4/1997 | Kim | 257/431 |
| 5,949,089 | * 9/1999 | Kim et al. | 257/40 |
| 5,952,779 | 9/1999 | Ala et al. | 313/504 |
| 5,969,474 | 10/1999 | Ala | 313/504 |

FOREIGN PATENT DOCUMENTS

| 2-139893 | 5/1990 | (JP) . |
| 5-3080 | 1/1993 | (JP) . |
| 5-343183 | 12/1993 | (JP) . |
| 6-163158 | 6/1994 | (JP) . |
| 8-288069 | 11/1996 | (JP) . |
| 9-17574 | 1/1997 | (JP) . |
| 10-125474 | 5/1998 | (JP) . |
| 10-270172 | 10/1998 | (JP) . |
| 10-340787 | 12/1998 | (JP) . |

OTHER PUBLICATIONS

S. Tokito, et al., J. Phys. D: Appl. Phys., vol. 29, No. 11, pp. 2750–2753, "Metal Oxides as a Hole–Injecting Layer for an Organic Electroluminescent Device", Nov. 14, 1996.

* cited by examiner

Primary Examiner—William Mintel
(74) Attorney, Agent, or Firm—Oblon, Spivak, McClelland, Maier & Neustadt, P.C.

(57) ABSTRACT

The object of the invention is to provide a high-efficiency, long-life yet low-cost organic EL device which possesses the merits of both an organic material and an inorganic material. This object is achieved by the provision of an organic EL device which comprises a hole injecting electrode and an electron injecting electrode between which an organic layer having at least a light emitting layer is provided, an inorganic insulating electron transporting layer provided between the light emitting layer and the electron injecting layer, a hole injecting and transporting layer provided between the light emitting layer and the hole injecting electrode, and an organic electron injecting layer provided between the inorganic insulating electron transporting layer and the electron injecting layer.

13 Claims, 2 Drawing Sheets

PRIOR ART

FIG. 3

PRIOR ART

ORGANIC ELECTROLUMINESCENT DEVICE

BACKGROUND OF THE INVENTION

1. Art Field

The present invention relates generally to an organic EL (electroluminescent) device, and more specifically to an inorganic/organic junction structure used for a device comprising an organic compound thin film which emits light at in applied electric field.

2. Background Art

An organic EL device is now under development and investigation so that it can be used for display purposes, because it can be formed over a large area. In general, an organic EL device is basically built up of ITO or other transparent electrode formed on a glass substrate, an organic amine base hole transporting layer laminated on the transparent electrode, an organic light emitting layer formed of a material having electronic conductivity and giving out strong light emission, for instance, an Alq3 material, and an electrode provided on the organic light emitting layer and formed of a material having a low work function, for instance, an MgAg material.

As reported so far in the art, the device has a structure wherein one or plural organic compound layers are interleaved between a hole injecting electrode and an electron injecting electrode. The organic compound layer has a double- or triple-layer structure.

Examples of the double-layer structure are a structure wherein a hole transporting layer and a light emitting layer are formed between the hole injecting electrode and the electron injecting electrode, and a structure wherein a light emitting layer and an electron transporting layer are formed between the hole injecting electrode and the electron injecting electrode. In an exemplary triple-layer structure, a hole transporting layer, a light emitting layer and an electron transporting layer are provided between the hole injecting electrode and the electron injecting electrode. A single-layer structure wherein a single layer has all functions, too, is reported in conjunction with a polymer or mixture system.

Figure 2:
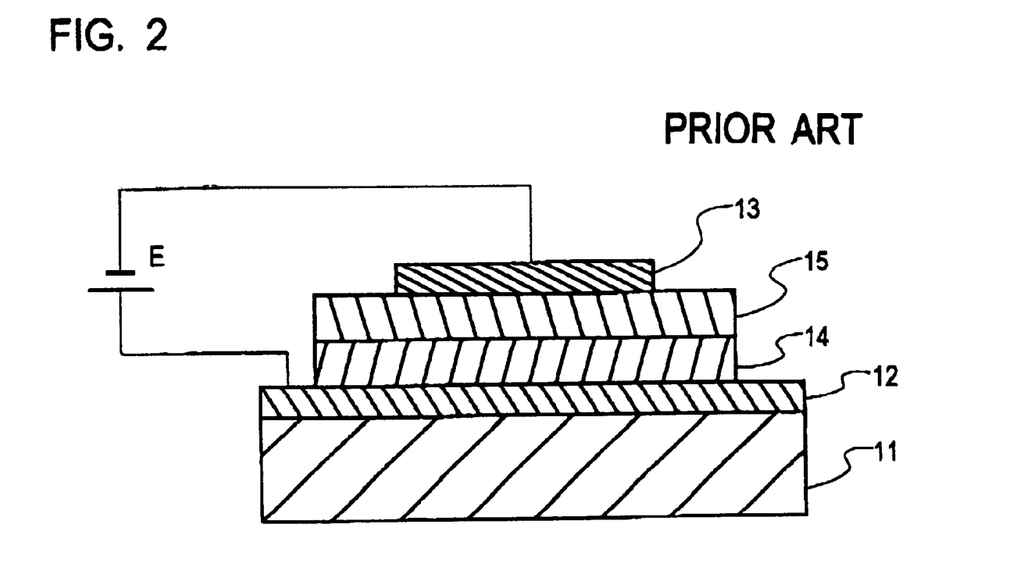
FIG. 2 is a sectional schematic of one architecture example of a prior art organic EL device.
Figure 3:
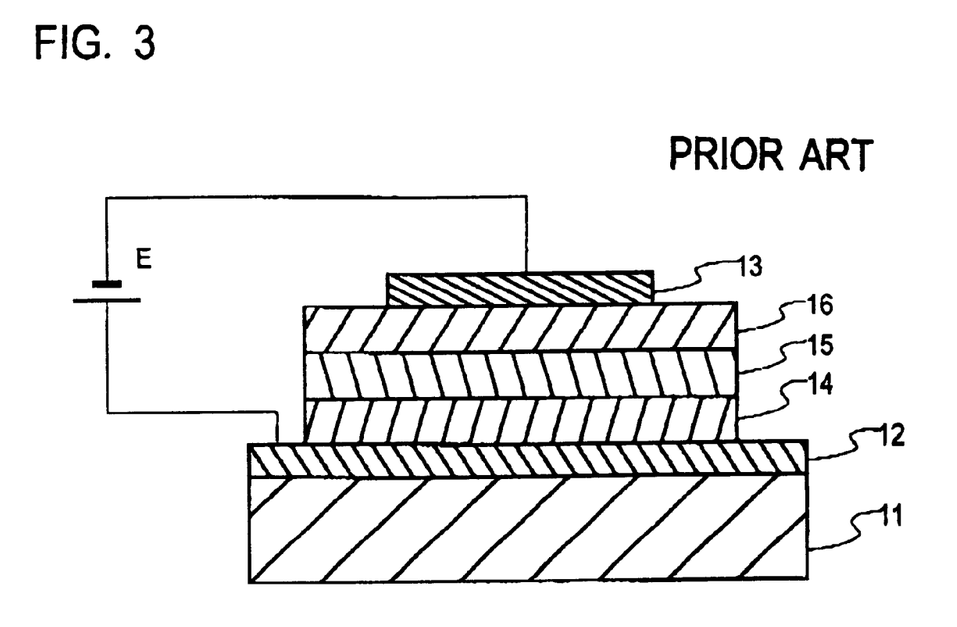
FIG. 3 is a sectional schematic of another architecture example of the prior art organic EL device.

Typical structures of the organic EL device are shown in FIGS. 2 and 3.

In FIG. 2, a hole transporting layer 14 and a light emitting layer 15, each made of an organic compound, are formed between a hole injecting electrode 12 provided on a substrate 11 and an electron injecting electrode 13. In this case, the light emitting layer 15 also functions as an electron transporting layer.

In FIG. 3, a hole transporting layer 14, a light emitting layer 15 and an electron transporting layer 16, each made of an organic compound, are formed between a hole injecting electrode 12 provided on a substrate 11 and an electron injecting electrode 13.

A problem common to these organic EL devices is reliability. In principle, an organic EL device comprises a hole injecting electrode and an electron injecting electrode and requires an organic layer for efficient injection and transportation of holes and electrons from between these electrodes. However, these materials are sensitive to damages during device fabrication, and offer a problem in conjunction with an affinity for electrodes. Another problem is that the deterioration of an organic thin film is more severe than that of an LED or LD.

An electroluminescent (EL) device emits light under the influence of an applied electric field. The action of a semiconductor layer forming such an EL manifests itself through radiative combination of electron-hole pairs injected from a pair of electrodes into the semiconductor. One example of this is a light emitting diode based on a GaP semiconductor or other similar group III–V semiconductor. Although these devices are utilized effectively and in wide fields, yet application thereof to large-area displays is not only difficult but also uneconomical because their size is very minute. Some replacements applicable to large-area displays are known in the art. Of such inorganic semiconductors, ZnS is the most useful. However, one non-negligible practical problem with this system is that it is poor in reliability. In one mechanism to which ZnS relates, a kind of carrier is accelerated through the semiconductor in a strong electric field. This is believed to cause local excitation of the semiconductor, which decays upon radiative emission.

To provide a solution to such problems, methods of taking advantage of merits of both an organic material and an inorganic semiconductor material have been envisaged. That is, an organic/inorganic semiconductor junction structure wherein an organic hole transporting layer is substituted by an inorganic p-type semiconductor has been under consideration. Such consideration has been reviewed in Japanese Patent No. 2636341, and JP-A's 2-139893, 2-207488 and 6-119973. However, it is still difficult to obtain an organic EL device superior to prior art organic ELs in terms of emission performance and basic device reliability.

SUMMARY OF THE INVENTION

One object of the invention is to provide a high-efficiency, long-life yet low-cost organic EL device which possesses the merits of both an organic material and an inorganic material.

The above object is achieved by the embodiments defined below.

(1) An organic EL device which comprises:
- a hole injecting electrode and an electron injecting electrode between which an organic layer having at least a light emitting layer is provided,
- an inorganic insulating electron transporting layer provided between said light emitting layer and said electron injecting layer,
- a hole injecting and transporting layer provided between said light emitting layer and said hole injecting electrode, and
- an organic electron injecting layer provided between said inorganic insulating electron transporting layer and said electron injecting layer.

(2) The organic EL device according to (1), wherein said inorganic insulating electron transporting layer contains as a main component one or two or more oxides selected from strontium oxide, magnesium oxide, calcium oxide, lithium oxide, rubidium oxide, potassium oxide, sodium oxide, and cesium oxide.

(3) The organic EL device according to (1), wherein said inorganic insulating electron transporting layer contains said main component in an amount of 80 to 99 mol % and a stabilizer in an amount of 1 to 20 mol %, each per all components thereof.

(4) The organic EL device according to (1), wherein said inorganic insulating electron transporting layer has a thickness of 0.1 to 2 nm.

(5) The organic EL device according to (1), wherein said hole injecting and transporting layer is defined by a high-resistance inorganic hole injecting and transporting layer capable of blocking electrons and having a conduction path for carrying holes.

(6) The organic EL device according to (5), wherein said high-resistance inorganic hole injecting and transporting layer has a resistivity of 1 to $1\times10^{11}$ Ω·cm.

(7) The organic EL device according to (5), wherein said high-resistance inorganic hole injecting and transporting layer contains at least one of a metal and/or an oxide, carbide, nitride, silicide and boride of said metal.

(8) The organic EL device according to (5), wherein said high-resistance inorganic hole injecting and transporting layer contains as a main component an oxide of silicon and/or germanium as represented by $(Si_{1-x}Ge_x)O_y$ where $0 \leq x \leq 1$ and $1.7 \leq y \leq 2.2$, and further contains at least one of a metal having a work function of at least 4.5 eV and/or an oxide, carbide, nitride, silicide and boride of said metal.

(9) The organic EL device according to (8), wherein said metal is at least one selected from Au, Cu, Fe, Ni, Ru, Sn, Cr, Ir, Nb, Pt, W, Mo, Ta, Pd, and Co.

(10) The organic EL device according to (8), which contains said metal and/or said oxide, carbide, nitride, silicide and boride of said metal in an amount of 0.2 to 40 mol %.

(11) The organic EL device according to (5), wherein said high-resistance inorganic hole injecting and transporting layer has a thickness of 0.2 to 100 nm.

(12) The organic EL device according to (1), wherein said hole injecting and transporting layer is defined by an inorganic insulating hole injecting and transporting layer which contains as a main component an oxide of silicon and/or germanium as represented by $(Si_{1-x}Ge_x)O_y$ where $0 \leq x \leq 1$ and $1.7 \leq y \leq 1.99$.

(13) The organic EL device according to (12), wherein said inorganic insulating hole injecting and transporting layer has a thickness of 0.1 to 3 nm.

EXPLANATION OF THE PREFERRED EMBODIMENTS

The organic EL device according to the invention comprises a hole injecting electrode and an electron injecting electrode between which an organic layer having at least a light emitting layer is provided, an inorganic insulating electron injecting and transporting layer provided between the light emitting layer and the electron injecting layer, and an organic electron injecting layer provided between the inorganic insulating electron transporting layer and the electron injecting layer.

For the electron injecting electrode material, it is preferable to use a substance having a low work function. For instance, use may be made of pure metal elements such as K, Li, Na, Mg, La, Ce, Ca, Sr, Ba, Al, Ag, In, Sn, Zn, and Zr, and a binary or ternary alloy system serving as a stabilizer and containing the elements, and oxides of the elements. Use may also be made of oxides and fluorides of alkali metals such as Li, Na, K, Rb, and Cs. Exemplary alloys are Ag.Mg (Ag: 0.1 to 50 at %), Al.Li (Li: 0.01 to 12 at %), In.Mg (Mg: 50 to 80 at %), and Al.Ca (Ca: 0.01 to 20 at %). For the electron injecting electrode layer, a single or multilayer thin film made up of these materials is used.

The electron injecting electrode thin film should preferably have at least a certain thickness enough to inject electrons or a thickness of at least 0.1 nm, preferably at least 0.5 nm, and more preferably at least 1 nm. Although there is no particular upper limit to the electron injecting electrode thickness, the electron injecting electrode may usually have a thickness of the order of 1 to 500 nm. Additionally, an auxiliary electrode (protective electrode) may be located on the electron injecting electrode.

The auxiliary electrode should preferably have at least a certain thickness enough to ensure electron injection efficiency and prevent entrance of moisture, oxygen or organic solvents or a thickness of preferably at least 50 nm, more preferably at least 100 nm, and even more preferably 100 to 500 nm. With too thin an auxiliary electrode, neither is its own effect obtainable, nor is sufficient connection with terminal electrodes obtainable because the ability of the auxiliary electrode to cover steps becomes low. When the auxiliary electrode is too thick, on the other hand, the growth rate of dark spots becomes unacceptably high because of an increase in the stress of the auxiliary electrode.

The auxiliary electrode should preferably be formed of the optimum material chosen depending on the electron injecting electrode material used in combination therewith. For instance, a low-resistance metal such as Al may be used if it is important to make up for low electron injection efficiency of the electron injecting electrode, and a metal compound such as TiN may be used if emphasis is placed on sealability.

Preferably but not exclusively, the total thickness of the electron injecting electrode plus the auxiliary electrode should usually be the order of 50 to 500 nm.

The hole injecting electrode should preferably be composed of a material that can efficiently inject holes in the hole injecting layer, etc. and has a work function of 4.5 eV to 5.5 eV, for instance, a material composed mainly of any one of tin-doped indium oxide (ITO), zinc-doped indium oxide (IZO), indium oxide ($In_2O_3$), tin oxide ($SnO_2$), and zinc oxide (ZnO). It is here to be noted that these oxides may deviate slightly from their stoichiometric compositions. Regarding ITO, it is desired that the mixing ratio of $SnO_2$ with respect to $In_2O_3$ be in the range of 1 to 20 wt %, and especially 5 to 12 wt %. Regarding IZO, the mixing ratio of ZnO with respect to $In_2O_3$ is usually in the range of about 12 to 32 wt %.

The hole injecting electrode may further contain silicon oxide ($SiO_2$) for work function control. The content of silicon oxide ($SiO_2$) should preferably be of the order of 0.5 to 10% in terms of the molar ratio of $SiO_2$ to ITO. The incorporation of $SiO_2$ contributes to an increase in the work function of ITO.

The electrode on the side out of which light is taken should preferably have a light transmittance of at least 50%, preferably at least 80%, and more preferably at least 90% with respect to light emitted at an emission wavelength of usually 400 to 700 nm. With decreasing transmittance, the light emitted from the light emitting layer attenuates, and so it is difficult to obtain the luminance needed for an light emitting device.

The electrode should preferably have a thickness of 50 to 500 nm, and especially 50 to 300 nm. Although there is no particular upper limit to the electrode thickness, too thick an electrode gives rise to concerns such as a transmittance drop, and defoliation. Too thin an electrode fails to obtain sufficient effect, and offers a problem in conjunction with film thickness, etc. during device fabrication.

In the organic EL device of the invention, the inorganic electron transporting layer is provided between the light emitting layer and the electron injecting electrode (cathode) by way of the organic layer.

By the provision of the inorganic insulating electron transporting layer made up of the inorganic material, it is possible to achieve an organic EL device having merits of both the inorganic material and the organic material. That is, stable physical properties are achieved at interfaces between the electrode and the light emitting layer or electron injecting and transporting layer, so that device fabrication can be expedited, and luminance equivalent to or higher than that of a prior art device comprising an organic electron injecting layer can be obtained. Thus, the EL device of the invention is longer in service life than the prior art device and less susceptible to leakage and dark spots than the prior art device. Moreover, the organic EL device of the invention can be fabricated at lower costs because not only a relatively expensive organic material but also inexpensive, easily available, and easy-to-produce inorganic material can be used.

The inorganic insulating electron transporting layer has functions of facilitating injection of electrons from the cathode side, providing stable transportation of electrons, and blocking holes. This layer provides confinement therein of more holes and electrons injected in the light emitting and so optimizes hole-electron recombination areas, resulting in emission efficiency improvements.

By constructing the inorganic insulating electron transporting layer of the aforesaid main component, etc., it is possible to use a metal electrode having relatively high stability and good conductivity with no special provision of an electrode having a function of injecting electrons. This makes the electron injection and transportation efficiency of the inorganic insulating electron injecting and transporting layer high and, hence, the life of the device long.

The inorganic insulating electron transporting layer contains as the main component one or two or more oxides selected from oxides of lithium oxide ($Li_2O$), rubidium oxide ($Rb_2O$), potassium oxide ($K_2O$), sodium oxide ($Na_2O$), cesium oxide ($Cs_2O$), strontium oxide (SrO), magnesium oxide (MgO), and calcium oxide (CaO). These oxides may be used alone or in combination of two or more. When two or more such oxides are used, they may be mixed together at any desired ratio. Of these oxides, strontium oxide is most preferred. Next is magnesium oxide, calcium oxide, lithium oxide ($Li_2O$), then rubidium oxide ($Rb_2O$), then potassium oxide ($K_2O$), and finally sodium oxide ($Na_2O$). When the oxides are used in a mixture form, it is preferable that the mixture contains at least 40 mol % of strontium oxide, and at least 40 mol %, especially at least 50 mol % of lithium oxide and rubidium oxide in all.

The inorganic insulating electron transporting layer should preferably contain as a stabilizer silicon oxide ($SiO_2$) and/or germanium oxide ($GeO_2$). These oxides, when used in an admixture form, may be mixed together at any desired ratio.

While each of the aforesaid oxides is present usually with a stoichiometric composition, it is understood that it may have a non-stoichiometric composition deviating slightly therefrom.

The inorganic insulating electron transporting layer according to the invention should preferably contain, per all components thereof:
a main component: 80 to 99 mol %, more preferably 90 to 95 mol %
a stabilizer: 1 to 20 mol %, more preferably 5 to 10 mol % as calculated on SrO, MgO, CaO, $Li_2O$, $Rb_2O$, $K_2O$, $Na_2O$, $Cs_2O$, $SiO_2$, and $GeO_2$ bases.

The inorganic insulating electron transporting layer should have a thickness of preferably 0.1 to 2 nm, and more preferably 0.3 to 0.8 nm. When the electron injecting layer is too thick or thin, it is impossible to make full use of its own function.

The inorganic insulating electron transporting layer may further contain as impurities H, and Ne, Ar, Kr, Xe, etc. used for sputtering gases in a total amount of 5 at % or less.

It is to be noted that if the inorganic insulating electron transporting layer has such an average composition as a whole, it is then acceptable that the layer is not uniform or has a concentration gradient in the thickness direction.

The inorganic insulating electron transporting layer is usually in an amorphous state.

The aforesaid inorganic insulating electron transporting layer may be fabricated by various physical or chemical thin-film formation techniques such as a sputtering technique, and an evaporation technique, with the sputtering technique being preferred. Particular preference is given to a multi-sputtering technique wherein targets for the first and second components are separately sputtered. In the multi-sputtering technique, suitable sputtering processes can be applied to the respective targets. In a single sputtering technique, it is preferable to use a mixed target wherein the first and second components are mixed together.

When the inorganic insulating electron transporting layer is formed by means of the sputtering technique, the gas pressure for sputtering should preferably be in the range of 0.1 to 1 Pa. For the sputtering gas, inert gases used with ordinary sputtering systems, for instance, Ar, Ne, Xe, and Kr may be used, if required, together with $N_2$. For a reactive sputtering process, these sputtering gases may be mixed with about 1 to 99% of $O_2$ to provide a sputtering atmosphere.

For the sputtering technique, an RF sputtering process using an RF power source, a DC sputtering process, etc. may be used. A sputtering system should preferably be operated at 0.1 to 10 $W/cm^2$ for RF sputtering, with a film deposition rate of 0.5 to 10 nm/min., and especially 1 to 5 nm/min.

A substrate should be set in the range of room temperature (25° C.) to about 150° C. during film deposition.

The organic EL device of the invention comprises the inorganic electron transporting layer plus an organic electron injecting layer in addition to the light emitting layer that is an organic layer.

For the electron injecting layer composed of an organic material, it is preferable to use a material capable of injecting and transporting electrons.

Usable for the electron injecting layer, for instance, are quinoline derivatives such as organic metal complexes containing quinoline derivatives, especially 8-quinolinol or its derivatives as ligands, in particular, tris(8-quinolinolato) aluminum (Alq3), oxadiazole derivatives, perylene derivatives, pyridine derivatives, pyrimidine derivatives, quinoxaline derivatives, diphenylquinone derivatives, and nitro-substituted fluorene derivatives.

In the invention, the electron injecting and transporting layer may also serve as a light emitting layer. Preferably in this case, tris(8-quinolinolato)aluminum, etc. should be used. The electron injecting layer may be formed as by deposition by evaporation as is the case with the light emitting layer.

Preferably but not exclusively, the organic electron injecting layer should have usually a thickness of about 5 to 500 nm, and especially 10 to 300 nm although varying with how to form it.

The light emitting layer is made up of one organic compound thin film taking part in at least a light emission function or formed by lamination of two or more such organic compound thin films.

The light emitting layer has functions of injecting holes and electrons, transporting them, and recombining holes and electrons to create excitons. For the light emitting layer, it is preferable to use a relatively electronically neutral compound, so that the electrons and holes can be easily injected and transported in a well-balanced state.

Preferably but not exclusively, the thickness of the light emitting layer should be of the order of usually 5 to 500 nm, and especially 10 to 300 nm although varying depending on their formation techniques.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, etc., quinacridone, rubrene, and styryl dyes. Use may also be made of quinoline derivatives such as metal complex dyes containing 8-quinolinol or its derivatives as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in JP-A 8-12600 (Japanese Patent Application No. 6-110569) and tetraarylethene derivatives disclosed in JP-A 8-12969 (Japanese Patent Application No. 6-114456).

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by volume, and especially 0.1 to 5% by volume, and the content of the rubrene compound is in the range of preferably 0.01 to 20% by volume. By using the fluorescent compound in combination with the host substance, it is possible to vary the wavelength performance of light emission of the host substance, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato) aluminum, and poly[zinc(II)-bis(8-hydroxy-5-quinolinyl) methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato)(p-phenylphenolato)aluminum (III), bis(2-methyl-8-quinolinolato)(2,3-dimethylphenolato) aluminum (III),bis(2-methyl-8-quinolinolato)(2,6-dimethylphenolato) aluminum (III), bis(2-methyl-8-quinolinolato) (3,4-dimethylphenolato) aluminum (III), bis (2-methyl-8-quinolinolato) (3,5-dimethylphenolato) aluminum (III), bis(2-methyl-8-quinolinolato)(3,5-di-tert-butylphenolato)aluminum (III), bis(2-methyl-8-quinolinolato)(2,6-diphenylphenolato)aluminum (III), bis (2-methyl-8-quinolinolato)(2,4,6-triphenyl-phenolato) aluminum (III), bis(2-methyl-8-quinolinolato) (2,3,6-trimethylphenolato) aluminum (III), bis(2-methyl-8-quinolinolato)(2,3,5,6-tetramethylphenolato)aluminum (III), bis(2-methyl-8-quinolinolato)(1-naphtholato) aluminum (III), bis(2-methyl-8-quinolinolato)(2-naphtholato)aluminum (III), bis(2,4-dimethyl-8-quinolinolato)(o-phenylphenolato)aluminum (III), bis(2,4-dimethyl-8-quinolinolato)(p-phenylphenolato) aluminum (III), bis(2,4-dimethyl-8-quinolinolato)(m-phenylphenolato)aluminum (III), bis(2,4-dimethyl-8-quinolinolato) (3,5-dimethylphenolato)aluminum (III), bis(2,4-dimethyl-8-quinolinolato)(3,5-di-tert-butylphenolato)aluminum (III), bis(2-methyl-4-ethyl-8-quinolinolato)(p-cresolato)aluminum (III), bis(2-methyl-4-methoxy-8-quinolinolato)(p-phenylphenolato)aluminum (III), bis(2-methyl-5-cyano-8-quinolinolato)(o-cresolato) aluminum (III), and bis(2-methyl-6-trifluoromethyl-8-quinolinolato)(2-naptholato)aluminum (III).

Besides, use may be made of bis(2-methyl-8-quinolinolato)aluminum (III)-μ-oxo-bis(2-methyl-8-quinolinolato) aluminum (III), bis(2,4-dimethyl-8-quinolinolato)aluminum (III)-μ-oxo-bis(2,4-dimethyl-8-quinolinolato)aluminum (III), bis(4-ethyl-2-methyl-8-quinolinolato)aluminum (III)-μ-oxo-bis(4-ethyl-8-quinolinolato)aluminum (III), bis(2-methyl-4-methoxyquinolinolato)aluminum (III)-μ-oxo-bis (2-methyl-4-methoxyquinolinolato)aluminum (III), bis(5-cyano-2-methyl-8-quinolinolato) aluminum (III)-μ-oxo-bis (5-cyano-2-methyl-8-quinolinolato)aluminum (III), bis(2-methyl-5-trifluoromethyl-8-quinolinolato)aluminum (III)-μ-oxo-bis(2-methyl-5-trifluoromethyl-8-quinolinolato) aluminum (III), etc.

Other preferable host substances include phenylanthracene derivatives disclosed in JP-A 8-12600 (Japanese Patent Application No. 6-110569), tetraarylethene derivatives disclosed in JP-A 8-12969 (Japanese Patent Application No. 6-114456), etc.

In the invention, the light emitting layer may also serve as an electron injecting and transporting layer. In this case, it is preferable to use a fluorescent material, e.g., tris(8-quinolinolato)aluminum or the like, which may be provided by deposition by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by volume, and especially 0.1 to 15% by volume.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later.

For the compounds capable of injecting and transporting electrons, it is preferable to use metal complexes containing quinoline derivatives, especially 8-quinolinol or its derivatives as ligands, in particular, tris(8-quinolinolato) aluminum (Alq3). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with respect to the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, especially 10/90 to 90/10, and more especially 20/80 to 80/20.

The mixed layer should have preferably a thickness that is equal to or larger than the thickness of a single molecular layer and less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation here the selected compounds are evaporated from different evaporation sources. When the compounds to be mixed have nearly identical or very close vapor pressures (evaporation temperatures), however, they may have previously been mixed together in the same evaporation boat for the subsequent evaporation. Preferably, the compounds are uniformly mixed together in the mixed layer. However, the compounds in an island form may be present in the mixed layer. The light emitting layer may generally be formed at a given thickness by the evaporation of the organic fluorescent substance or coating a dispersion of the organic fluorescent substance in a resin binder.

No special limitation is imposed to conditions for vacuum evaporation. However, the vacuum evaporation should preferably be carried out at a degree of vacuum of up to $10^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

In the organic EL device of the invention, an organic hole injecting and transporting layer may be provided as the hole injecting and transporting layer between the light emitting layer and the hole injecting electrode.

Usable for the organic hole injecting and transporting layer, for instance, are various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. These compounds may be used singly or in combination of two or more. Where two or more such compounds are used, they may be stacked as separate layers, or otherwise mixed.

Preferably, the light emitting layer, the organic hole injecting and transporting layer, and the electron transporting layer are formed by a vacuum evaporation process because a uniform thin film can then be obtained. With the vacuum evaporation process, it is thus possible to obtain a uniform thin film in an amorphous state or with a grain size of up to 0.2 μm. A grain size of greater than 0.2 μm results in non-uniform light emission. To avoid this, it is required to make the driving voltage of the device high. However, this in turn gives rise to some considerable drop of hole or electron injection efficiency.

No special limitation is imposed to conditions for vacuum evaporation. However, the vacuum evaporation should preferably be carried out at a degree of vacuum of up to $10^{-4}$ Pa and a deposition rate of about 0.01 to 1 nm/sec. Also, the layers should preferably be continuously formed in vacuo, partly because the deposition of impurities on the interface between adjacent layers is avoidable resulting in the achievement of high performance, and partly because the driving voltage of the device can be lowered with elimination of dark spots or no growth of dark spots.

When the layers, each containing a plurality of compounds, are formed by the vacuum evaporation process, it is preferable that co-evaporation is carried out while each boat with the compounds charged therein is placed under temperature control.

In another organic EL device embodiment of the invention, a high-resistance hole injecting and transporting layer may be provided as the hole injecting and transporting layer between the light emitting layer and the hole injecting electrode.

By locating between the light emitting layer and the hole injecting electrode the high-resistance inorganic hole injecting and transporting layer having hole conduction paths and capable of blocking electrons, it is thus possible to inject holes in the light emitting layer with high efficiency, resulting in further improvements in light emission efficiency and a lowering of driving voltage.

Preferably, an oxide of a metal such as silicon, and germanium or a semi-metal should be used as a main component of the high-resistance inorganic hole injecting and transporting layer and at least one of a metal having a work function of at least 4.5 eV, preferably 4.5 to 6 eV, a semi-metal and/or an oxide, carbide, nitride, silicide and boride thereof should be incorporated into the layer, thereby forming an electrical conduction path, so that holes can efficiently be injected from the hole injecting layer in the organic layer on the light emitting layer side. In addition, migration of holes from the organic layer to the hole injecting electrode can be inhibited, thereby ensuring efficient recombination of holes and electrons in the light emitting layer. Furthermore, it is possible to achieve an organic EL device having the merits of both the inorganic material and the organic material. The organic EL device of the invention has luminance equivalent to or higher than that of a device comprising a prior art organic electron injecting and transporting layer, and is higher in heat resistance and weather resistance than such a device. Thus, the EL device of the invention is longer in service life than the prior art device and less susceptible to leakage and dark spots than the prior art device. Moreover, the organic EL device of the invention can be fabricated at lower cost because not only a relatively expensive organic material but also an inexpensive, easily available, and easy-to-produce inorganic material can be used.

The inorganic hole injecting and transporting layer of high resistance should preferably have a resistivity of 1 to $1\times10^{11}$ $\Omega \cdot cm$, and especially $1\times10^3$ to $1\times10^8$ $\Omega \cdot cm$. By limiting the resistivity of the inorganic hole injecting and transporting layer of high resistance to the above range, it is thus possible to achieve remarkable improvements in hole injection efficiency while high electron block capabilities are kept. The resistivity of the inorganic hole injecting and transporting layer of high resistance may be found from sheet resistance and thickness. In this case, the sheet resistance may be measured as by a four-terminal method.

The main component material is an oxide or oxides of silicon and germanium, and should preferably be represented by $(Si_{1-x}Ge_x)O_y$, wherein $0 \leq x \leq 1$ and $1.7 \leq y \leq 2.2$, preferably $1.7 \leq y \leq 1.99$. The main component of the high-resistance inorganic hole injecting and transporting layer in a thin film form may be either silicon oxide and/or germanium oxide. When y deviates from this range, the hole injection function tends to become low. The composition in this case may be determined by Rutherford back scattering, chemical analysis, etc.

In addition to the main component, the high-resistance inorganic hole injecting and transporting layer should preferably contain an oxide, carbide, nitride, silicide and boride of a metal (inclusive of a semi-metal) having a work function of at least 4.5 eV. The metal having a work function of at least 4.5 eV, preferably 4.5 to 6 eV should preferably be at least one metal selected from Au, Cu, Fe, Ni, Ru, Sn, Cr, Ir, Nb, Pt, W, Mo, Ta, Pd and Co. These are generally present in the form of metals or oxides. Carbides, nitrides, silicides and borides of these metals, too, may be used. The content of each metal should be preferably 0.2 to 40 mol %, and more preferably 1 to 20 mol %. At a smaller content the hole injection function becomes low, and at a larger content the electron block function becomes low. When these metals are used in combination of two or more, their total content should be in the aforesaid range.

The aforesaid metal or the oxide, carbide, nitride, ilicide, and boride of the metal (inclusive of a semi-metal) are usually dispersed in the high-resistance inorganic hole injecting and transporting layer. The dispersed particles have usually a particle diameter of the order of 1 to 5 nm. It appears that between the conductive dispersed particles there is a hopping path for carrying holes by way of the main component of high resistance.

The high-resistance inorganic hole injecting and transporting layer may further contain as impurities H, and Ne, Ar, Kr, Xe, etc. used for sputtering gases in a total amount of 5 at % or less.

It is to be noted that if the high-resistance inorganic hole injecting and transporting layer has such an average composition as a whole, it is then acceptable that the layer is not uniform or has a concentration gradient in the thickness direction.

The high-resistance inorganic hole injecting and transporting layer is usually in an amorphous state.

The inorganic hole injecting and transporting layer of high resistance should preferably have a thickness of about 0.2 to 100 nm, especially 0.2 to 30 nm, and more especially about 0.2 to 10 nm. Too large or small a thickness does not allow the hole injecting and transporting layer to make full use of its own hole injecting function.

The high-resistance inorganic hole injecting and transporting layer may be fabricated by various physical or chemical thin-film formation techniques such as a sputtering technique, and an evaporation technique, with the sputtering technique being preferred. Particular preference is given to a multi-sputtering technique wherein targets for the main component and the metal or metal oxide, etc. are separately sputtered. In the multi-sputtering technique, suitable sputtering processes can be applied to the respective targets. In a single sputtering technique, it is preferable to gain composition control by suitable regulation of the area ratio of a main component target and a small piece of the metal, metal oxide or the like placed on the target.

The high-resistance inorganic hole injecting and transporting layer is formed by means of the sputtering technique under the same film formation and other conditions as in the case of the aforesaid inorganic insulating electron injecting and transporting layer.

The organic EL device of the invention, because of comprising the high-resistance inorganic hole injecting and transporting layer, can be improved in terms of heat resistance and weather resistance and, hence, service life. By using an inexpensive, easily available inorganic material rather than a relatively expensive organic material, device production can be facilitated, resulting in production cost reductions. Satisfactory connections with the electrodes formed of inorganic materials, which is one prior art problem, too, are well achievable. This in turn can prevent occurrence of leakage currents and dark spots.

In yet another organic EL device embodiment of the invention, an inorganic insulating hole injecting and transporting layer may be provided as the hole injecting and transporting layer between the light emitting layer and the hole injecting electrode. This inorganic insulating hole injecting and transporting layer comprises as a main component an oxide (oxides) of silicon and/or germanium.

In this regard, it is desired that the average composition of the main component, preferably that as measured by Rutherform back scattering be represented by $(Si_{1-x}Ge_x)O_y$ wherein $0 \leq x \leq 1$ and $1.7 \leq y \leq 1.99$.

By limiting the oxides that are the main components of the inorganic insulating hole injecting and transporting layer to the above composition range, it is thus possible to efficiently inject holes from the hole injecting electrode in the organic layer on the light emitting layer side. In addition, migration of holes from the organic layer to the hole injecting electrode can be inhibited, thereby ensuring efficient recombination of holes and electrons in the light emitting layer. The inorganic insulating hole injecting and transporting layer provided for the purpose of injecting and transporting holes does not emit light when a reverse bias is applied thereto. Furthermore, it is possible to achieve an organic EL device having the merits of both the inorganic material and the organic material, which device can effectively be applied especially to a display required having high emission luminance, for instance, a display driven in a time division mode. The organic EL device of the invention has luminance equivalent to or higher than that of a device comprising a prior art organic hole injecting and transporting layer, and is higher in heat resistance and weather resistance than such a device. Thus, the EL device of the invention is longer in service life than the prior art device and less susceptible to leakage and dark spots than the prior art device. Moreover, the organic EL device of the invention can be fabricated easily at lower cost because an inexpensive yet easily available inorganic material rather than a relatively expensive organic material can be used.

The letter y that represents the content of oxygen should preferably be in the aforesaid composition range or $1.7 \leq y \leq 1.99$. Any deviation of y from this range causes a drop of hole injection capabilities, resulting in a luminance drop. Preferably, $1.85 \leq y \leq 1.98$.

The inorganic insulating hole injecting and transporting layer in a thin film form may be composed of silicon oxide and/or germanium oxide. The composition ratio x should be $0 \leq x \leq 1$, preferably $0 \leq x \leq 0.4$, more preferably $0 \leq x \leq 0.3$, and even more preferably $0 \leq x \leq 0.2$.

Alternatively, it is desired that x be equal to or greater than 0.6, preferably 0.7, and more preferably 0.8.

Preferably but not exclusively, the content of oxygen should be represented in terms of an average value across film as measured by Rutherford back scattering. However, it is also acceptable to make use of other analytical methods capable of obtaining the same precise measurements.

Additionally, the inorganic insulating hole injecting and transporting layer may contain as impurities Ne, Ar, Kr, Xe, etc. used for sputtering gases in a total amount of up to 10 at %, preferably about 0.01 to 2% by weight, and especially about 0.05 to 1.5% by weight. The inorganic insulating hole injecting and transporting layer may contain one or two or more such elements. When two or more such elements are contained in the layer, they may be mixed together at any desired ratio.

These elements, which are used as sputtering gases, enter the inorganic insulating hole injecting and transporting layer during its formation. As the contents of the elements increase, the trapping effect decreases to an extreme level, failing to obtain any desired performance.

The content of the sputtering gas is determined depending on the film deposition pressure, the flow ratio of the sputtering gas and oxygen and the film deposition rate in general, and the film deposition pressure in particular. To keep the content of the sputtering gas within the aforesaid range, it is desired that film formation take place on a high vacuum side, for instance, at a pressure of up to 1 Pa, especially 0.1 to 1 Pa.

In this regard, it is noted that if the inorganic insulating hole injecting and transporting layer has such a composition as the whole average value, it is then acceptable that the layer is not uniform or has a concentration gradient in its thickness direction. Preferably in this case, the organic (light emitting) layer interface side should be poor in oxygen.

The inorganic insulating hole injecting and transporting layer is usually in an amorphous state.

Preferably but not exclusively, the inorganic insulating hole injecting and transporting layer should have a thickness of 0.05 to 10 nm, especially 0.1 to 5 nm, and more especially 1 to 5 nm or about 0.5 to 3 nm. Too small or large a thickness renders it impossible for the hole injecting layer to make full use of its own function.

The inorganic insulating hole injecting and transporting layer may be fabricated by means of various physical or chemical thin film-formation techniques such as a sputtering process and an EB vapor deposition process, although the sputtering technique is preferred.

The organic EL device of the invention, because of comprising the inorganic hole injecting and transporting layer, can be improved in terms of heat resistance and weather resistance and, hence, service life. By using an inexpensive, easily available inorganic material rather than a relatively expensive organic material, device production can be facilitated, resulting in production cost reductions. Satisfactory connections with the electrodes formed of inorganic materials, which is one prior art problem, too, are well achievable. This in turn can prevent occurrence of leakage currents and dark spots.

Preferably, the device is sealed up by means of a sealing sheet, etc. for the purpose of preventing degradation of the organic layers and electrodes in the device. To prevent penetration of moisture, the sealing sheet is bonded to the device using an adhesive resin layer to seal up the device. An inert gas such as Ar, He, and $N_2$ is preferably used as a sealing gas. Then, the sealing gas should preferably have a moisture content of up to 100 ppm, especially up to 10 ppm, and more especially up to 1 ppm. Although there is no particular lower limit to the moisture content, the sealing gas should usually have a moisture content of about 0.1 ppm.

The sealing sheet, preferably in a flat sheet form, may be made of transparent or translucent materials such as glasses, quartz, and resins, among which the glasses are preferred. For such glass materials, alkali glass is preferable from a cost standpoint. Other preferable glass materials, for instance, include soda lime glass, lead alkali glass, borosilicate glass, aluminosilicate glass, and silica glass. In particular, a soda glass material subjected to no surface treatment is inexpensive and so is preferable. A metal sheet, a plastic sheet or the like, too, may be used in place of the sealing glass sheet.

For height control, a spacer is used to keep the sealing sheet at a height as desired. The spacer material may be resin beads, silica beads, glass beads, glass fibers, etc., with the glass beads being most preferred. The spacer is usually in a particulate form having a uniform particle size. In the invention, however, a spacer of any desired shape may be used provided that it can function well. The spacer size should preferably be 1 to 20 $\mu$m, especially 1 to 10 $\mu$m, and more especially 2 to 8 $\mu$m as calculated on a circle diameter basis. A spacer having such a diameter should preferably have a particle length of up to about 100 $\mu$m. Although there is no particular lower limit to the particle size, the particle size should usually be equal to or larger than the diameter.

The spacer may or may not be used when recesses are provided in the sealing sheet. When the spacer is used, its size is preferably within the aforesaid range, and more preferably within the range of 2 to 8 $\mu$m.

The spacer may have been incorporated in the sealing adhesive agent or may be incorporated in the sealing adhesive agent at the time of bonding. The content of the spacer in the sealing adhesive agent should be preferably 0.01 to 30 wt %, and more preferably 0.1 to 5 wt %.

For the adhesive agent, it is preferable to use a cation curing epoxy resin of the ultraviolet curing type, although an adhesive agent of the type that ensures stable adhesion strength and good airtightness may be used.

For the substrate on which an organic EL structure is formed according to the invention, a noncrystalline substrate such as a glass or quartz substrate, and a crystalline substrate such as an Si, GaAs, ZnSe, ZnS, GaP or InP substrate may be used. The crystalline substrate may also be provided with a crystalline or noncrystalline buffer layer or a metal buffer layer. For a metal substrate, Mo, Al, Pt, Ir, Au, Pd, and other metal substrates may be used. However, it is preferable to use a glass substrate. The substrate is usually located on the side out of which light is taken, and so it should preferably be transparent to light as in the above electrodes.

In the invention, a number of devices may be arranged on a plane. A color display may be constructed by changing the colors of light emitted from the devices arranged on the plane.

The substrate may be provided with a color filter film, fluorescent material-containing color conversion film or dielectric reflecting film for controlling the color of light emission.

For the color filter film, a color filter employed with liquid crystal display devices, etc. may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the fluorescent substance contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. When the color conversion filter film is provided on the substrate while it is in contact with the hole injecting electrode, it is also preferable to use a binder material that is not damaged during hole injecting electrode (ITO or IZO) film formation.

The light absorbing material is used when light is not fully absorbed by the fluorescent material, and so may be dispensed with, if not required. For the light absorbing material, it is preferable to make a selection from materials that do not extinguish fluorescence.

The organic EL device of the invention is generally of the DC drive type or pulse drive type while it may be of the AC drive type. The applied voltage is generally of the order of 2 to 30 volts.

Figure 1:
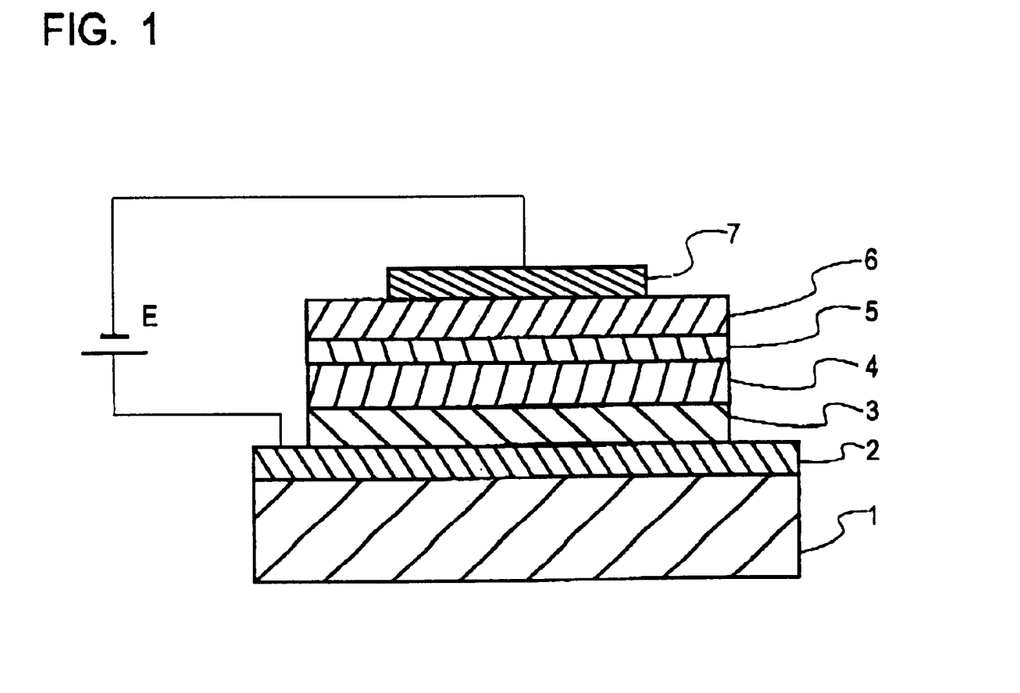
FIG. 1 is a sectional schematic of one basic embodiment of the organic EL device according to the invention.

The organic EL device of the invention may have such construction as shown in FIG. 1, wherein, in order from a substrate 1, a hole injecting electrode 2, a hole injecting and trasporing layer 3, a light-emitting layer 4, an inorganic insulating electron transporting layer 5, an organic electron injecting layer 6 and an electron injecting electrode 7 are laminated or otherwise stacked on the substrate 1. This order of lamination may be reversed to set up a so-called reverse multilayer structure. These may be appropriately selected, for instance, depending on display specifications, fabrication processes, etc. In FIG. 1, a driving power source E is connected between the hole injecting electrode 2 and the electron injecting electrode 7.

If the devices of the invention are placed one upon another in the thickness direction, it is then possible to gain tone control of emitted light and obtain displays in multiple colors.

The organic EL device or devices of the invention may be applied not only to display systems but also to various optical systems such as pickups used for reading/writing memories, photocouplers, and relay devices in optical communication transmission lines.

EXAMPLE

Example 1

A 7059 substrate (made by Corning) used as a glass substrate was scrubbed with neutral detergent.

At a substrate temperature of 250° C., an ITO hole injecting electrode layer of 200 nm in thickness was formed on the substrate by means of an RF magnetron sputtering process using an ITO oxide target.

Then, the substrate with the ITO electrode layer, etc. formed thereon was washed on its surface with $UV/O_3$, and then fixed to a substrate holder in a vacuum evaporation system, which was then evacuated to a vacuum of $1 \times 10^{-4}$ Pa or lower.

Then, MTDATA was deposited by evaporation at a deposition rate of 0.1 nm/sec to a thickness of 10 nm thereby forming a hole injecting layer and TPD was deposited by evaporation at a deposition rate of 0.1 nm/sec. to a thickness of 20 nm thereby forming a hole transporting layer.

Subsequently, N,N,N',N'-tetrakis(m-biphenyl)-1,1'-biphenyl-4,4'-diamine (TPD), tris(8-quinolinolato) aluminum (Alq3) and rubrene were deposited by evaporation at a total deposition rate of 0.2 nm/sec. to a thickness of 40 nm, thereby forming a light emitting layer. The mixture of TPD and Alq3 at 1:1 by weight was doped with 5 vol % of rubrene.

With the vacuum maintained, the substrate was transferred to a sputtering system. Using a target obtained by mixing as the raw materials strontium oxide (SrO), lithium oxide ($Li_2O$) and silicon oxide ($SiO_2$) in the respective amounts of:

SrO: 80 mol %
$Li_2O$: 10 mol %
$SiO_2$: 10 mol % per all components thereof, an inorganic electron injecting and transporting layer of 0.8 nm in thickness was formed on the substrate. This sputtering was carried out at room temperature (25° C.), a film deposition rate of 1 nm/min., an operating pressure of 0.5 Pa and a power input of 5 $W/cm^2$, using Ar as a sputtering gas. At this time, the inorganic electron injecting and transporting layer was first formed to a thickness of 0.4 nm while the sputtering gas consisting of 100% Ar was fed at 100 SCCM, and to a thickness of 0.4 nm while the sputtering gas consisting of Ar and $O_2$ at 1:1 was fed at 100 SCCM.

With the vacuum still maintained, tris(8-quinolinolato) aluminum (Alq3) was then deposited by evaporation at an overall deposition rate of 0.2 nm/sec. to a thickness of 30 nm, thereby forming an electron injecting layer.

With the vacuum still maintained, AlLi (Li: 7 at %) was then deposited by evaporation to a thickness of 1 nm, and Al was subsequently deposited by evaporation to a thickness of 200 nm, thereby forming an electron injecting and an auxiliary electrode, respectively. Finally, the thus obtained EL structure was sealed up by glass to obtain an organic EL device.

The obtained organic EL device was driven at a constant current density of 10 mA/cm² in the air. It was then found that an initial luminance of 950 cd/m² was obtained at a driving voltage of 6.9 V.

Example 2

Organic EL devices were prepared as in Example 1 with the exception that the main component and stabilizer of the inorganic insulating electron transporting layer was changed from SrO to MgO, CaO or an oxide mixture thereof, from $Li_2O$ to $K_2O$, $Rb_2O$, $K_2O$, $Na_2O$, $Cs_2O$ or an oxide mixture thereof, from $SiO_2$ to $GeO_2$ or an oxide mixture of $SiO_2$ and $GeO_2$. Substantially similar results were obtained. When the cathode-forming material was changed from Al to Ag, In, Ti, Cu, Au, Mo, W, Pt, Pd, Ni or an alloy thereof, too, similar results were obtained.

Example 3

In Example 1, a high-resistance inorganic hole injecting and transporting layer of 2 nm in thickness was formed by means of a sputtering system wherein an Au pellet of given size was placed on an $SiO_2$ target. This sputtering was carried out at room temperature (25° C.), a film deposition rate of 1 nm/min., an operating pressure of 0.2 to 2 Pa and a power input of 500 W, using a sputtering gas containing 30 sccm of Ar and 5 sccm of $O_2$. The thus obtained high-resistance inorganic hole injecting and transporting layer was found to have a composition of $SiO_{1.9}$ with 4 mol % of Au contained in it.

Under otherwise similar conditions as in Example 1, an organic EL device was prepared.

The obtained organic EL device was estimated as in Example 1. As a result, nearly similar results as in Example 1 were obtained; however, higher emission luminance was obtained at a lower driving voltage.

Example 4

In Example 3, a high-resistance inorganic hole injecting and transporting layer of 20 nm in thickness was formed while an Au pellet of given size was placed on an $GeO_2$ target. This sputtering was carried out at room temperature (25° C.), a film deposition rate of 1 nm/min., an operating pressure of 0.2 to 2 Pa and a power input of 500 W, using a sputtering gas containing 30 sccm of Ar and 5 sccm of $O_2$. The thus obtained high-resistance inorganic hole injecting and transporting layer was found to have a composition of $GeO_2$ with 2 mol % of Au contained in it.

Under otherwise similar conditions as in Example 3, an organic EL device was prepared.

The obtained organic EL device was estimated as in Example 1. As a result, nearly similar results as in Example 3 were obtained.

Example 5

Organic EL devices were prepared as in Example 1 with the exception that the high-resistance inorganic hole injecting and transporting layers in Examples 3 and 4 were prepared at varying flow rates of sputtering gas $O_2$ while the main compositions of targets were changed to $SiO_{1.7}$, $SiO_{1.95}$, $GeO_{1.96}$, and $Si_{0.5}Ge_{0.50}O_{1.92}$, and estimated as in Example 1 in terms of light emission luminance. Substantially similar results were obtained.

Example 6

As in Examples 3 to 5, organic EL devices were prepared with the exception that the metal in each high-resistance inorganic electron injecting layer was changed from Au to at least one of Cu, Fe, Ni, Ru, Sn, Cr, Ir, Nb, Pt, W, Mo, Ta, Pd and Co or oxides, carbides, nitrides, silicides and borides thereof. In these cases, too, similar results were obtained.

Example 7

In Example 1, am inorganic hole injecting and transporting layer of 2 nm in thickness was formed by means of a sputtering system wherein an $SiO_2$ target was used. This sputtering was carried out at 25° C., a film deposition rate of 1 nm/min., an operating pressure of 0.5 Pa and a power input of 500 W/cm2, using as a sputtering gas Ar containing 5% of $O_2$. The thus obtained hole injecting and transporting layer was found to have a composition of $SiO_{1.9}$.

Under otherwise similar conditions as in Example 1, an organic EL device was prepared. The obtained organic EL device was estimated as in Example 1. As a result, nearly similar results as in Example 1 were obtained with the exception of improved emission luminance.

Example 8

An inorganic insulating hole injecting and transporting layer was prepared as in Example 7 with the exception that $SiO_2$ was used as a target composition and the flow rate of $O_2$ in the sputtering gas was changed to an $O_2$ to Ar ratio of 5%, thereby obtaining a composition $SiO_{1.9}$. Under otherwise similar conditions as in Example 1, an organic EL device was prepared. An inorganic insulating hole injecting and transporting layer was similarly prepared with the exception that $SiO_2$ was used as a target composition and the flow rate of $O_2$ in the sputtering gas was changed to an $O_2$ to Ar ratio of 30%, thereby obtaining a composition $SiO_{1.95}$. Under otherwise similar conditions as in Example 1, an organic EL device was prepared. An inorganic insulating hole injecting and transporting layer was similarly prepared with the exception that $GeO_2$ was used as a target composition and the flow rate of $O_2$ in the sputtering gas was changed to an $O_2$ to Ar ratio of 30%, thereby obtaining a composition $GeO_{1.96}$. Under otherwise similar conditions as in Example 1, an organic EL device was prepared. An inorganic insulating hole injecting and transporting layer was similarly prepared with the exception that $Si_{0.5}Ge_{0.5}O_2$ was used as a target composition and the flow rate of $O_2$ in the sputtering gas was changed to an $O_2$ to Ar ratio of 10%, thereby obtaining a composition $Si_{0.5}Ge_{0.5}O_{1.92}$. Under otherwise similar conditions as in Example 1, an organic EL device was prepared. These devices were estimated as in Example 1.

It was consequently found that all the devices gave much the same results as in Example 7.

Comparative Example

In Example 1, MTDATA was deposited by evaporation at a deposition rate of 0.1 nm to a thickness of 10 nm on a substrate with an ITO hole injecting electrode provided thereof, thereby forming a hole injecting layer, and TPD was then deposited by evaporation at a deposition rate of 0.1 nm/sec. to a thickness of 20 nm, thereby forming a hole transporting layer. After the formation of a light emitting layer, tris(8-quinolinolato)aluminum (Alq3) was deposited by evaporation at a deposition rate of 0.2 nm/sec to a thickness of 40 nm, thereby forming an organic electron injecting and transporting layer. Under otherwise similar conditions as in Example 1, an organic EL device was prepared and estimated. An initial luminance upon driven at a constant current density of 10 mA/cm² was 750 cd/m².

EFFECTIVENESS OF THE INVENTION

According to the invention as explained above, it is possible to provide a high-efficiency, long-life yet low-cost organic EL device having the merits of both an organic material and an inorganic material.

What we claim is:

1. An organic EL device which comprises:

a hole injecting electrode and an electron injecting electrode between which an organic layer having at least a light emitting layer is provided, an inorganic insulating electron transporting layer provided between said light emitting layer and said electron injecting electrode, a hole injecting and transporting layer provided between said light emitting layer and said hole injecting electrode, and an organic electron injecting layer provided between said inorganic insulating electron transporting layer and said electron injecting electrode.

2. The organic EL device according to claim 1, wherein said inorganic insulating electron transporting layer contains as a main component one or more oxides selected from strontium oxide, magnesium oxide, calcium oxide, lithium oxide, rubidium oxide, potassium oxide, sodium oxide, and cesium oxide.

3. The organic EL device according to claim 2, wherein said inorganic insulating electron transporting layer contains said main component in an amount of 80 to 99 mol % and a stabilizer in an amount of 1 to 20 mol %, each per all components thereof.

4. The organic EL device according to claim 1, wherein said inorganic insulating electron transporting layer has a thickness of 0.1 to 2 nm.

5. The organic EL device according to claim 1, wherein said hole injecting and transporting layer is defined by a high-resistance inorganic hole injecting and transporting layer capable of blocking electrons and having a conduction path for carrying holes.

6. The organic EL device according to claim 5, wherein said high-resistance inorganic hole injecting and transporting layer has a resistivity of from 1 to $1 \times 10^{11}$ Ω·cm.

7. The organic EL device according to claim 5, wherein said high-resistance inorganic hole injecting and transporting layer contains at least one of a metal and/or an oxide, carbide, nitride, silicide and boride of said metal.

8. The organic EL device according to claim 5, wherein said high-resistance inorganic hole injecting and transporting layer contains as a main component an oxide of silicon and/or germanium as represented by $(Si_{1-x}Ge_x)O_y$ where $0 \leq x \leq 1$ and $1.7 \leq y \leq 2.2$, and further contains at least one of a metal having a work function of at least 4.5 eV and/or an oxide, carbide, nitride, silicide and boride of said metal.

9. The organic EL device according to claim 8, wherein said metal is at least one selected from Au, Cu, Fe, Ni, Ru, Sn, Cr, Ir, Nb, Pt, W, Mo, Ta, Pd, and Co.

10. The organic EL device according to claim 8, which contains said metal and/or said oxide, carbide, nitride, silicide and boride of said metal in an amount of 0.2 to 40 mol %.

11. The organic EL device according to claim 5, wherein said high-resistance inorganic hole injecting and transporting layer has a thickness of 0.2 to 100 nm.

12. The organic EL device according to claim 1, wherein said hole injecting and transporting layer is defined by an inorganic insulating hole injecting and transporting layer which contains as a main component an oxide of silicon and/or germanium as represented by $(Si_{1-x}Ge_x)O_y$ where $0 \leq x \leq 1$ and $1.7 \leq y \leq 1.99$.

13. The organic EL device according to claim 12, wherein said inorganic insulating hole injecting and transporting layer has a thickness of 0.1 to 3 nm.

* * * * *